(12) United States Patent
Smith, III

(10) Patent No.: US 6,316,808 B1
(45) Date of Patent: Nov. 13, 2001

(54) T-GATE TRANSISTOR WITH IMPROVED SOI BODY CONTACT STRUCTURE

(75) Inventor: George E. Smith, III, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/130,356

(22) Filed: Aug. 7, 1998

(51) Int. Cl.[7] .................................................. H01L 29/94
(52) U.S. Cl. .......................... 257/339; 257/346; 257/387; 257/365; 257/366; 257/153
(58) Field of Search .......................... 257/339, 347–355, 257/346, 387, 365, 366, 153

(56) References Cited

U.S. PATENT DOCUMENTS 5,405,795   4/1995   Beyer et al. .

OTHER PUBLICATIONS

SOI Technology: IBM's Next Advance In Chip Design, Aug. 6, 1998, Internet—http://www.chips.ibm.com/bluelogic/showcase/soi/soipaper.pdf.

*Primary Examiner*—Fetsum Abraham
(74) *Attorney, Agent, or Firm*—Lynn L. Augspurger

(57) ABSTRACT

Disclosed is a type "BC" body contacted SOI transistor and process for making these transistors in a manufacturing environment by providing a structure and process which removes overlay tolerance from the effective transistor width. The width is determined by RX on the top side, but by PC on the other with source and drain connected together. In the preferred embodiment such a structure is used as the top part of the SOI transistor with the bottom part a mirror image of the top part such that the effect of the PC to RX overlay is reversed, and the top part and bottom part are connected by a common body part. For the bottom part an "UP misalignment will make the device with large, while a "DOWN" misalignment will make the device width smaller. Thus, if PC is misalleged with respect to RX, any width errors introduced in the top part of the transistor will be exactly canceled by the bottom part of the transistor. An alternative DOG BONE embodiment is also illustrated which also provides a structure which removes the overlay tolerance from the effective transistor width.

3 Claims, 5 Drawing Sheets

T-GATE TRANSISTOR WITH IMPROVED SOI BODY CONTACT STRUCTURE

RELATED APPLICATIONS

The application entitled "Method and Improved SOI Body Contact Structure for Transistors", filed concurrently herewith as U.S. Ser. No. 09/130,357, filed Aug. 7, 1998 is related and filed by the same inventor, and assigned to the same assignee, International Business Machines Corporation, Armonk, N.Y. U.S.A.

FIELD OF THE INVENTION

This invention relates to transistors and particularly to an improved SOI body contract structure and process for creating such a structure in a manufacturing environment.

GLOSSARY

BC refers to a transistor of the body contacted type.
PC represents a shape that denotes the shape of poly-silicon structures.
RX represents a shape that denotes an opening in the field oxide, exposing active silicon.
Delta-W is the difference in finished manufactured dimension from the dimension drawn in the design.
Dog bone or DOG BONE means a contact shaped as shown in FIG. 11 having a shape generally like an "H", dog bone or femur.
Top-to-top "T" refers to a shape that generally denotes two "T"s which are mirror images of one another having their tops aligned in a generally parallel direction as illustrated by FIG. 10. Trademarks: S/390 and IBM are registered trademarks of International Business Machines Corporation, Armonk, N.Y. U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

A standard, non body contacted transistor will be described as is usually drawn as shown in FIG. 8 below. The areas labeled "S" and "D" represent the source and drain of the transistor. The gate is labeled with the word "Gate." The effective width of this transistor is determined only by the width of the RX opening in the oxide, which is the outer rectangle in this illustration. Any Delta-W term is due to any bias on the oxide opening. The tolerances that have to be included when computing the width are the RX image size and any tolerance on Delta-W. By special use of an existing process, the standard transistor structure can be improved and is useful in making complex circuits such as those used by IBM's S/390 processors. The problem with prior and existing SOI "BC" type body contact structures is that the cause the effective transistor width to vary depending upon the overlay tolerance between the PC and RX levels.

SUMMARY OF THE INVENTION

The invention illustrated in top view in FIG. 7, and provides a transistor in which the top part of the transistor can be and preferably is the same as existing structures, but the bottom part is the mirror image of the top part, and in the bottom part, the effect of PC to RX overlay is reversed, an "UP" misalignment will make the device width larger, while a "Down" misalignment will make the device width smaller. This removes the overlay tolerance from the effective transistor width.

DESCRIPTION OF THE DRAWINGS

FIG. 8 illustrates a standard non body contacted transistor, while

DETAILED DESCRIPTION OF THE INVENTION

Figure 8:
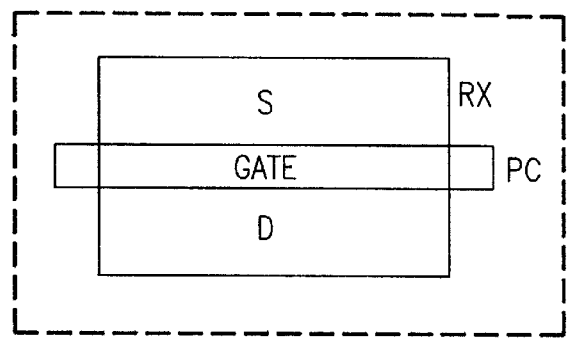
Figure 10:
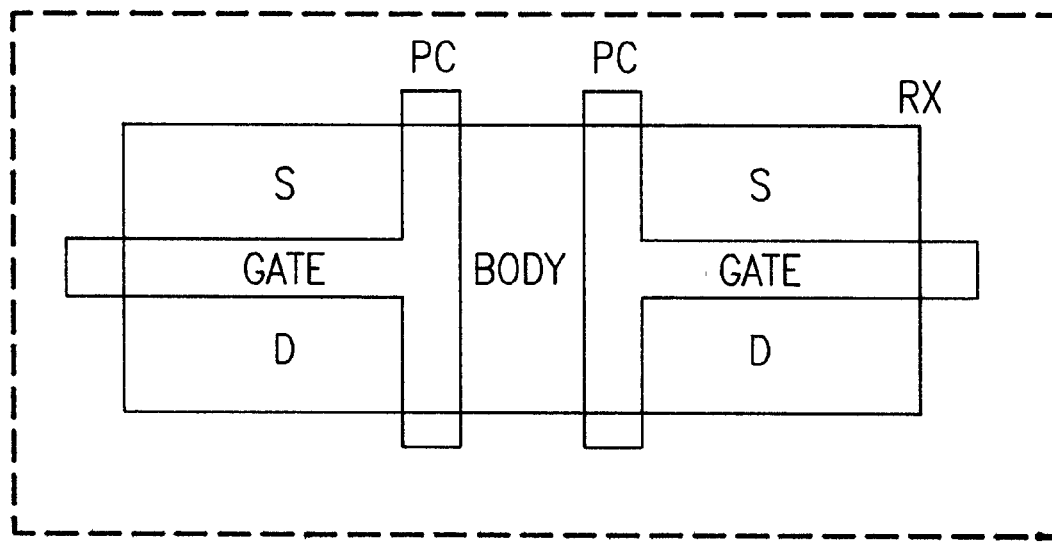

Before describing the preferred embodiment of the new SOI transistor which is now able to be made as illustrated in FIG. 10, a standard, non body contacted Transistor will be described as is usually drawn as shown in FIG. 8 below. The areas labeled "S" and "D" represent the source and drain of the transistor for the body contacted cell. The gate is labeled with the word "Gate." The effective width of this transistor is determined only by the width of the RX opening, which is the outer rectangle in this illustration. Any Delta-W term is due to any bias on the oxide opening. The tolerances that have to be included when computing the width are the RX image size and any tolerance on Delta-W.

Figure 9:
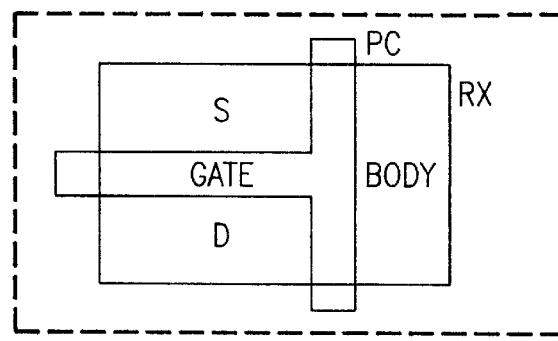
FIG. 9 illustrates a type "BC" body contacted transistor as described in U.S. Pat. No. 5,405,795, which represents the Prior Art which is improved upon by the invention herein described in its preferred embodiment illustrated in FIGS. 1–7 and 10; and, FIG. 10 is a view of the preferred embodiment of a new SOI transistor of FIG. 7 which is made by the process described.

A type "BC" body contacted transistor is shown next in FIG. 9. This is the transistor described in U.S. Pat. No. 5,405,795. As in FIG. 8, the areas labeled "S" and "D" represent the source and drain of the transistor and the gate is labeled with the word "Gate." Additionally, a new contact, labeled "Body" had been as shown in FIG. 9. It is assumed that the body contact is doped with the sample polarity as the body of the transistor (and the opposite polarity of the Source and Drain). A mask to do this is not shown in the interests of simplicity.

In this existing type of body contact transistor, illustrated by FIG. 9, the width is determined by RX on the left side, but by PC on the other. The Delta-W for the left edge is the same as for the standard transistor illustrated by FIG. 8, namely the oxide opening bias. On the right edge, however, Delta-W is due to an "effective width" for current under the "T" shaped part of the transistor gate. In addition to the tolerances for the standard transistor, the overlay tolerance between PC and RX must be included.

For example, in FIG. 9, if PC is aligned more "LEFT" with respect to RX, then the width of the device will be smaller by that amount. If it is aligned "UP" or "DOWN" with respect to RX, there is no effect on the transistor width. If it is aligned more "RIGHT" with respect to RX, the width of the device will be increased by that amount.

This disclosure's improvement in structure which is achieved by the processor for making it which will be described with respect to FIGS. 1–7 and shown in FIG. 10. As shown in FIG. 10, in the preferred embodiment, the left part of the SOI body contact transistor is the same as FIG. 9. The right part of the transistor gate topology viewed from the above is, however, the mirror image of the left part. As before the areas labeled "S" and "D" represent the source and drain of the body contact transistor, and the gate is labeled with the word "Gate", and the body contact is labeled with the word "Body". It is assumed that the body contact is doped with the sample polarity as the body of transistor (and the opposite polarity of the Source and Drain). A mask to do this is not shown in the interests of simplicity.

In the right part of the preferred embodiment illustrated by FIG. 10, the effect of the PC to RX overlay is reversed: an "LEFT" misalignment will make the device width larger, while a "RIGHT" misalignment will make the device width smaller.

When the topology of FIG. 10 is employed and two transistors formed as illustrated in FIG. 10 are connected in parallel, with "S" connected to "S", "D" connected to "D", and "Gate" connected to "Gate", the effects of PC to RX misalignment will cancel out and any change to the size of the right side will be compensated with an equal and opposite change on the left side.

Figure 11:
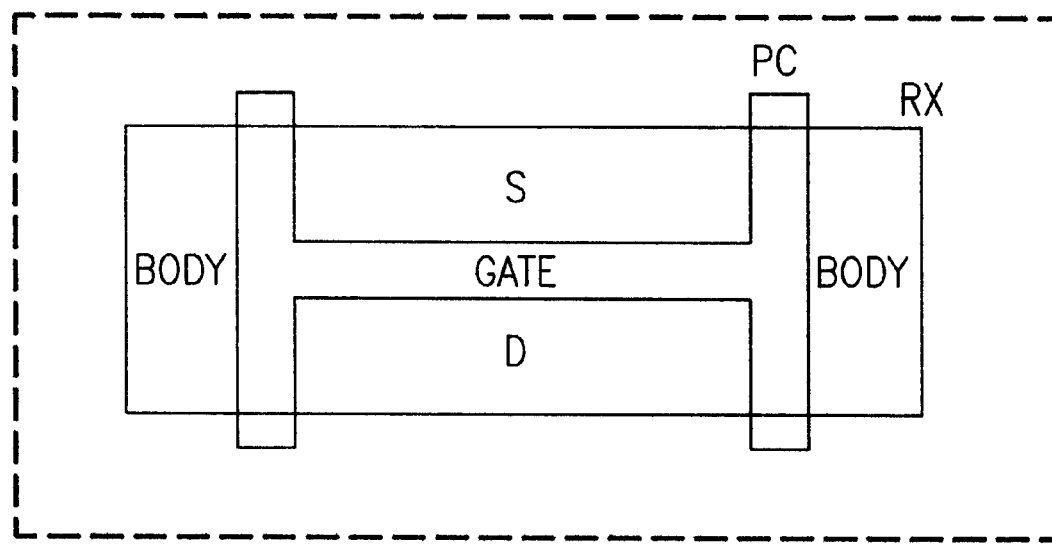
FIG. 11 shows the alternative DOG BONE embodiment of the invention manufactured by the process described with a dog bone mask.

An alternative implementation is shown in FIG. 11 (the "dog bone" version). The terminals are marked with the letters "S" and "D" to represent the source and drain, respectively, the word "GATE" to represent the gate, and the word "BODY" to represent a body connection point. This implementation shares the same property as FIG. 10, in that any PC to RX misalignment on the left side of the devices will be canceled out on the right side of the device.

Process for Manufacturing the Invention

The best implementation of this structure is a self-aligned body contact structure as shown in FIG. 10 representing the preferred embodiment of the SOI transistor.

Figure 7:
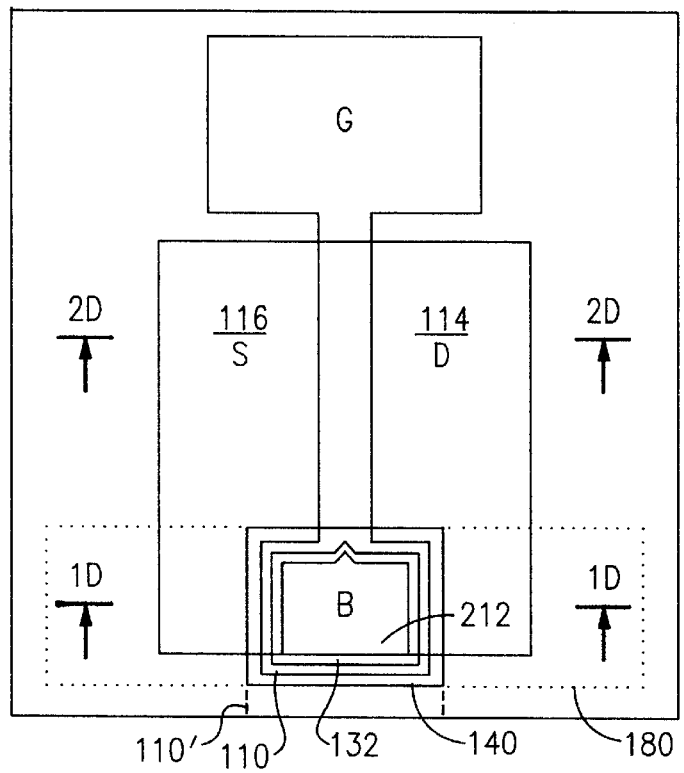
FIG. 7 illustrates the preferred embodiment in a top view of a transistor constructed according to the invention.

As we have said, as illustrated in top view in FIG. 7, and provides a transistor cell in which the top part of the transistor can be and preferably is the same as existing structures, but the bottom part is the mirror image of the top part, and in the bottom part, the effect of PC to RX overlay is reversed, an "UP" misalignment of the gate will make the device width larger, while a "Down" misalignment of the gate will make the device width smaller. This removes the overlay tolerance from the effective transistor width.

This is implemented by having the area labeled "Body" be doped to a high concentration using the parts of the topology applicable to the gate labeled "PC" as a diffusion mask. This will naturally make contact to the body regions under the "T" shaped diffusion masked part of each of the "PC" shapes.

In FIG. 7, a top view of a transistor constructed according to the invention shows source 116, and drain 114 separated by gate 110, which has self-aligned body contact B (the body contact being denoted generally by the numeral 212) formed at one end. For purposes of reference, a first axis will be referred to as being parallel to line 2D—2D, extending from the source to the drain and a second axis will be referred to as extending down the width of the gate. In FIGS. 1A–1D, there is shown in cross section through line 1D—1D in FIG. 7 where the body contact will be formed. A portion of a SOI wafer with a lower substrate 10, an SOI oxide (SiO2) layer 50 and a portion of the thin silicon layer 102 that has been patterned and then isolated by a conventional step of oxidizing the unwanted portions of layer 102 to form oxide 60. In an illustrative embodiment, the length along the first axis (along the line 1D—1D ) between the source and drain is about 1 $\mu$m or more and the corresponding gate length of the MOS device is <0.5 $\mu$m. Illustratively, layer 102 has a thickness of <80 nm.

Figure 1A:
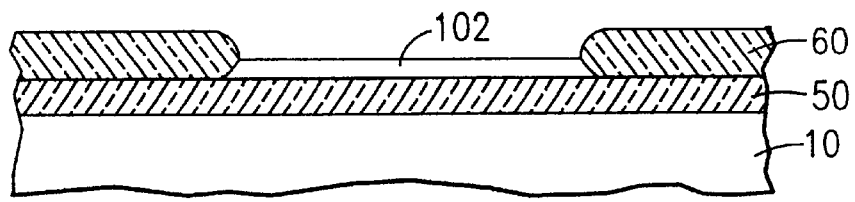
FIG. 1 illustrated in the steps of FIGS. 1A–1D, which show the transistor in cross section through line 1D—1D in FIG. 7 where the body contact will be formed.
Figure 1B:
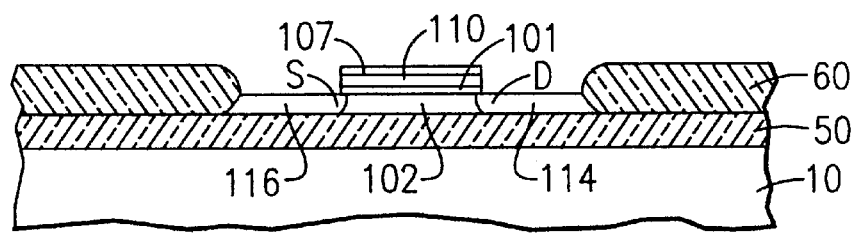

FIG. 1B shows the same area after a number of intermediate steps, A conventional gate stack of 5–10 nm of gate oxide 101, polycrystalline silicon (poly) layer 110 (in the range of 100–200 nm) which serves to provide the transistor gate, and the protective nitride (Si3 N4) gate dielectric 107 (12 nm) have been formed and source 116 and drain 114 have been implanted and annealed.

Figure 1C:
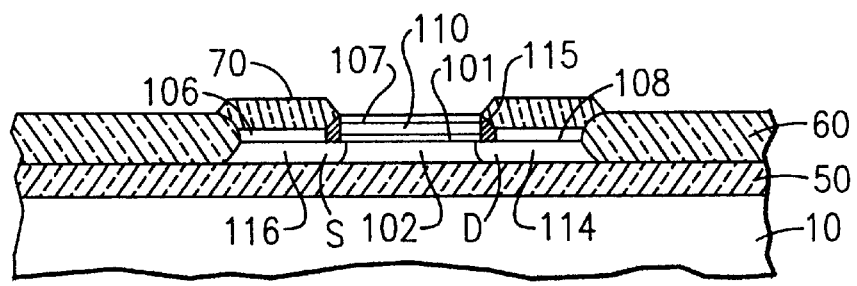
Figure 1D:
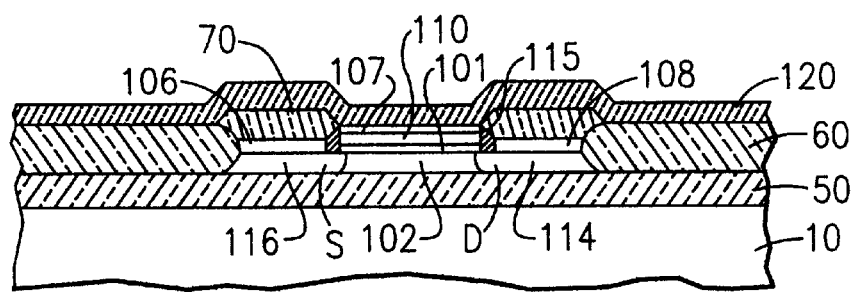
Figure 2A:
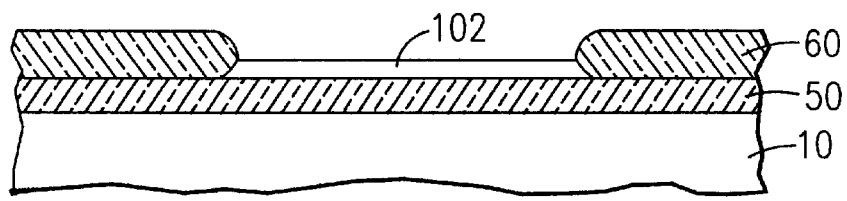
FIG. 2 illustrated in FIGS. 2A–2D shows the steps applied to the gate, through the cross section 2D—2D in FIG. 7.
Figure 2B:
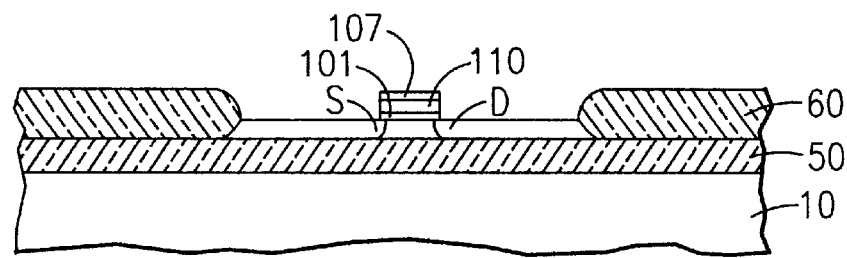
Figure 2C:
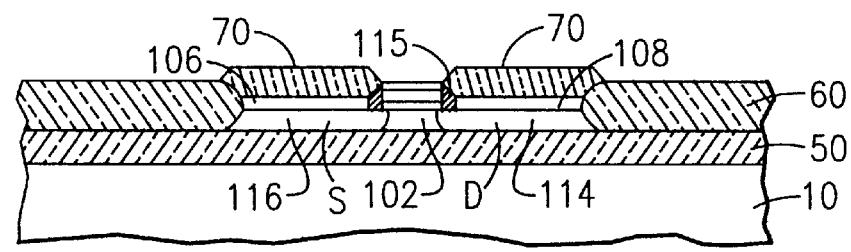
Figure 2D:
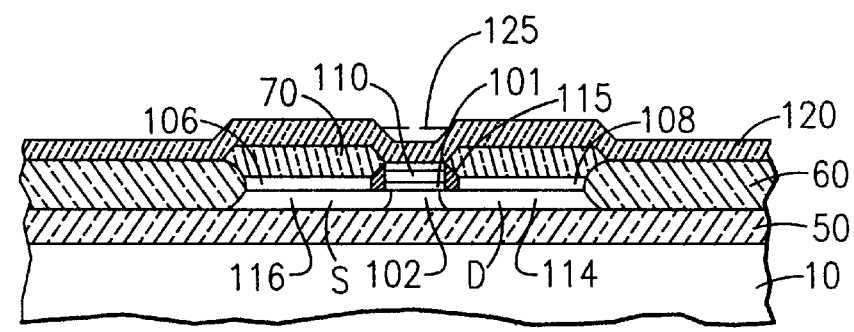

In FIG. 1C, a thin (10 nm) oxide layer has been grown on the edges of the gate stack, after which a 30 nm layer of CVD oxide have been deposited and etched to form outer gate side wall spacers 115 in a conventional process.

These outer spacers are not only used to provide LDD sources and drains, but also serve to isolate the gate from the poly raised source and drain contact members 106 and 108 that are next formed by selectively depositing 150 nm of doped CVD poly in the apertures above the source and drain. The top of spacers 106 and 108 is sealed by thermal cap oxide 70 (120 nm). In the illustrative embodiment, the cap oxide projects above the top of gate dielectric 107 by an amount sufficient to define a self-aligned aperture in a later step. The deposition of a conformal layer of CVD nitride 120 (FIG. 1D) over the gate and having a thickness sufficient to provide side walls thick enough to protect the gate (greater than one half the gate thickness) completes the steps shown in this figure.

FIGS. 2A–2D show the same steps applied to the gate having a "T" topology when viewed from the "top" of the wafer for the PC structure, through the cross section 2D—2D in FIG. 7 where the gate structure is formed. Note in FIG. 2D that the side walls of nitride 120 nearly meet over gate 110. A non-critical block out mask denoted in FIG. 7 by the dotted line labeled 180 is optionally used after the step shown in FIGS. 1D and 2D to expose the body contact area (212 in FIG. 7) only and to protect the gate. The dotted line 125 illustrates the situation when the thickness of nitride 120 is great enough that the side walls meet, referred to as the overlap thickness. In that case, the optional block out mask will not be needed. In the illustrative embodiment, if the top of the gate is a nominal 250 nm between source and drain and a thickness for nitride of 150 nm will ensure that the gate is protected during the aperture etch without the need of a block-out mask.

Figure 3:
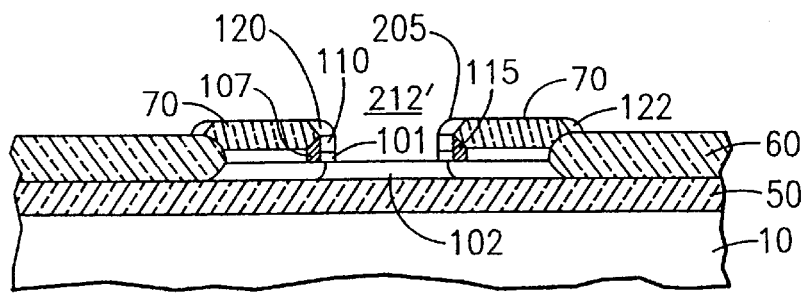
FIG. 3 shows the same region through line 1D—1D after etching nitride layers and poly layer of the transistor of FIG. 7.
Figure 4:
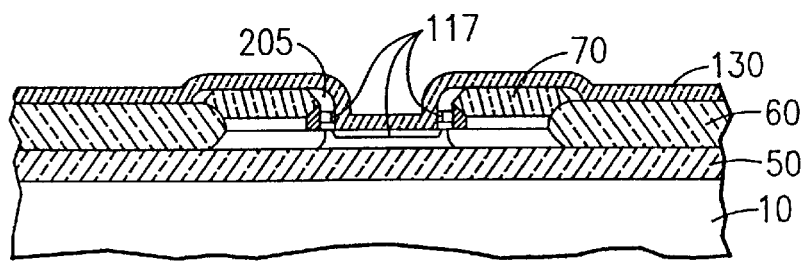
FIG. 4 illustrates the next step in which a conformal CVD nitride (or oxide-nitride) layer has been deposited over the wafer.
Figure 5:
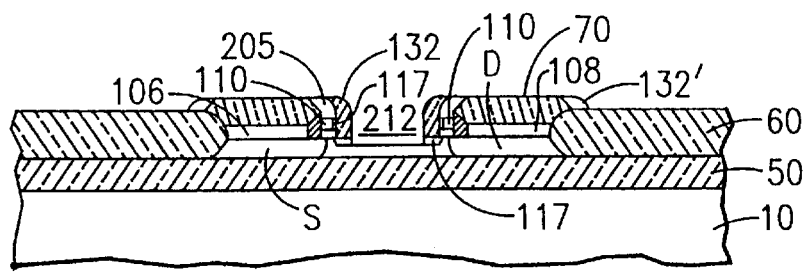
FIG. 5 illustrates the etching of the dielectric layer directionally in a conventional RIE process to access the substrate and form side walls.
Figure 6:
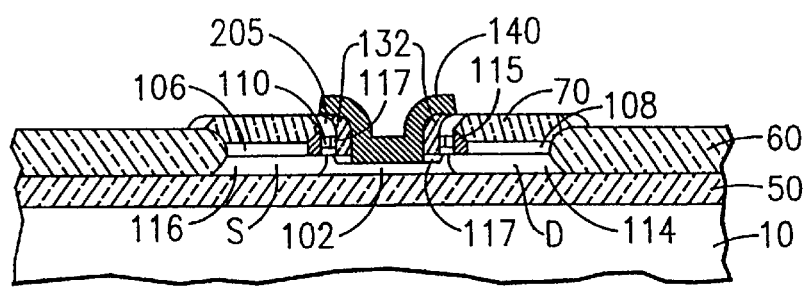
FIG. 6 shows that a poly layer 140 is deposited, doped with an appropriate dopant, patterned and annealed to form the body contact of the transistor illustrated in FIG. 7.

FIG. 3 shows the same region through line 1D—1D after etching nitride layers 120 and 107 and poly layer 110 in a conventional three step nitride, poly, and oxide reactive ion etch (RIE) with appropriate gases, stopping on the silicon layer 102, and leaving an aperture 212' that will hold the body contact 212. At this stage, there is a side wall member consisting of gate poly 110 above gate oxide 101 and top side walls formed from nitride 120, all denoted generally by the numeral 205, that is insulated from the source and drain by outer side walls 115. It will be apparent to those skilled in the art that there will need to be a corresponding side wall within aperture 212' to insulate the body contact from gate extension 210. The next step is shown in FIG. 4, in which conformal CVD nitride (or oxide-nitride) layer 130 has been deposited over the wafer, extending into the inner wall and the bottom of gate extension aperture 212'. The areas denoted with the numeral 117 indicate an optional re-oxidation before deposition of layer 130 of the inner surface of poly 110 and the part of layer 102 that is exposed during the aperture definition process. Dielectric layer 130 is directionally etched in a conventional RIE process to access the substrate and form side walls 132 shown in FIG. 5. Lastly, a poly layer 140 is deposited, doped with an appropriate dopant, patterned and annealed to form the body contact, as shown in FIG. 6. The dopant for the body contact must have the same polarity as the body (P-type for an N-FET).

A gate contact and source and drain contacts may be formed in any convenient manner, after which any convenient back end processing may be used to complete the circuit.

Those skilled in the art will appreciate that the length of gate extension 110 is not critical, since it may extend along the first axis over the extension of the source and drain area as much as required, since the portion of the active area occupied by gate extension 110 does not contribute to the current flow through the transistor. Thus, the alignment of aperture 212' with gate extension 110 is not critical, since extension 110 may be made wide enough to provide a comfortable tolerance.

The extensions of gate 110 that form side wall support members 205 surrounding aperture 212' serve to provide support for the internal and external side walls, thereby making a self-aligned aperture possible.

FIG. 11 shows the alternative DOG BONE embodiment of the invention manufactured by the process described with a dog bone mask.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A body contacted SOI transistor device formed upon a substrate, comprising:

a transistor having a source, and a drain separated by a gate which has a body contact therefor formed of a poly layer for contact with said gate, and wherein a shaped field oxide opening exposing active silicon is formed with a topology which overlaps the gate structure which separates the source and the drain and which has a linear extension area over the shaped field oxide opening as well as an area normal to said lineal extension area to define the gate for said transistor with which a first gate part of the transistor is mirrored by a second mirror image gate part of the first gate part when the topology of the gate is viewed from above, whereby a misalignment in a first direction will make the transistor device width larger, while a misalignment in a second direction opposite the first direction will make the device width smaller to remove overlay tolerance from the effective transistor width, and wherein the gate structure is formed of a pair of top-to-top "T" shaped elements which are laid to bound a single body with the area normal to the lineal extension area of each "T" being aligned and generally parallel to one another to bound and contact the body contact area of said transistor device.

2. A body contacted SOI transistor device formed upon a substrate, comprising:

a transistor having a source, and a drain separated by a gate which has a body contact therefor formed of a poly layer for contact with said gate, and wherein a shaped field oxide opening exposing active silicon is formed with a topology which overlaps the gate structure which separates the source and the drain and which has a linear extension area over the shaped field oxide opening as well as an area normal to said lineal extension area to define the gate for said transistor with which a first gate part of the transistor is mirrored by a second mirror image gate part of the first gate part when the topology of the gate is viewed from above, whereby a misalignment in a first direction will make the transistor device width larger, while a misalignment in a second direction opposite the first direction will make the device width smaller to remove overlay tolerance from the effective transistor width, and wherein source and drain terminals of the transistor device have a gate formed therebetween and the gate has at both ends of the gate extensions which are substantially perpendicular to the direction of the gate, and which bound and contact a body contact at each end of the gate structure.

3. A body contacted SOI transistor formed upon a substrate, according to claim 2 wherein the gate structure has a dog bone pattern and any misalignment toward one side of said oxide opening of the device will be cancelled out on the opposite side of the device.

* * * * *